(12) United States Patent
Wong et al.

(10) Patent No.: US 7,494,042 B2
(45) Date of Patent: Feb. 24, 2009

(54) METHOD OF FORMING LOW WIRE LOOPS AND WIRE LOOPS FORMED USING THE METHOD

(75) Inventors: Yam Mo Wong, Singapore (SG); Yi Bin Wang, Singapore (SG); Wei Liu, Singapore (SG)

(73) Assignee: ASM Technology Singapore Pte. Ltd., Singapore (SG)

( * ) Notice: Subject to any disclaimer, the term of this patent is extended or adjusted under 35 U.S.C. 154(b) by 789 days.

(21) Appl. No.: 10/677,604

(22) Filed: Oct. 2, 2003

(65) Prior Publication Data

US 2005/0072833 A1 Apr. 7, 2005

(51) Int. Cl.
*B23K 31/02* (2006.01)
(52) U.S. Cl. .................................................. 228/180.5
(58) Field of Classification Search ............... 228/180.5, 228/4.5, 1.1; 257/777, 784
See application file for complete search history.

(56) References Cited

U.S. PATENT DOCUMENTS

| | | | | |
|---|---|---|---|---|
| 5,156,323 A | | 10/1992 | Kumazawa et al. ......... 228/179 |
| 5,961,029 A | | 10/1999 | Nishiura et al. .......... 228/180.5 |
| 6,112,974 A | * | 9/2000 | Nishiura et al. .......... 228/180.5 |
| 6,182,885 B1 | * | 2/2001 | Nishiura et al. .......... 228/180.5 |
| 6,495,773 B1 | * | 12/2002 | Nomoto et al. ............. 174/260 |
| 6,815,836 B2 | * | 11/2004 | Ano ........................... 257/784 |
| 6,962,282 B2 | * | 11/2005 | Manansala ............... 228/180.5 |
| 2002/0047213 A1 | * | 4/2002 | Komiyama et al. ......... 257/777 |
| 2003/0166333 A1 | * | 9/2003 | Takahashi ................... 438/617 |
| 2004/0041008 A1 | * | 3/2004 | Mochida .................. 228/180.5 |
| 2004/0080056 A1 | * | 4/2004 | Lim et al. ................... 257/784 |
| 2004/0104477 A1 | * | 6/2004 | Fujisawa .................... 257/738 |
| 2004/0115918 A1 | * | 6/2004 | Kanda et al. ................ 438/612 |
| 2004/0152292 A1 | * | 8/2004 | Babinetz et al. ............ 438/617 |
| 2005/0189567 A1 | * | 9/2005 | Fujisawa .................... 257/200 |

\* cited by examiner

*Primary Examiner*—Kiley Stoner
(74) *Attorney, Agent, or Firm*—Ostrolenk, Faber, Gerb & Soffen, LLP

(57) ABSTRACT

A method of bonding wire between first and second bonding points with a bonding tool, such as a capillary, is disclosed. A first bond is formed at the first bonding point with the bonding tool, and further steps include moving the bonding tool away from the first bond by a first distance, then moving the bonding tool towards the first bonding point and coupling the wire to the first bond. Thereafter, the bonding tool is moved away from the first bond by a second distance and a kink is formed in the wire. The bonding tool is subsequently moved to extend a sufficient length of wire to form a wire loop between the first and second bonding points before the bonding tool is moved to the second bonding point to form a second bond. Characteristics of wire bonds formable using the method are also disclosed.

9 Claims, 6 Drawing Sheets

METHOD OF FORMING LOW WIRE LOOPS AND WIRE LOOPS FORMED USING THE METHOD

FIELD OF THE INVENTION

The invention relates to a method of forming wire loops between different bonding points on semiconductor devices, and in particular, to the formation of wire loops with low height profiles. The invention also relates to wire loops formable using the method.

BACKGROUND AND PRIOR ART

During certain semiconductor assembly processes, semiconductor dice are placed on a carrier such as a leadframe substrate. Electrical connections in the form of wire bonds are then made between the dice and substrate, or between individual dice. Gold, aluminium or copper wires are commonly used to make these connections. Wire bonds are formed at bonding sites where the electrical connections are to be made, typically using an ultrasonic transducer to generate ultrasonic energy to attach a length of wire fed from a capillary to the semiconductor device or carrier. After these wire bonds are made, the dice, wire loops and substrate are encapsulated with a resin material to protect the same. A semiconductor package is produced.

There is a continuing desire in the semiconductor industry to develop ever smaller and thinner semiconductor packages. Since, as explained above, the wire loops should be fully encapsulated in the final package, the thickness of the package would be affected by the heights of the wire loops that are formed during wire bonding. If the heights of the wire loops can be kept to a minimum, then the thickness of the final package can be correspondingly reduced.

Furthermore, there is a demand in the industry for semiconductor devices with stacked dice. The advantage of having stacked dice is that stacked dice incorporate more silicon functionality by stacking multiple dice into a single package. This reduces overall size by eliminating additional packages on the circuit board. Furthermore, it increases space savings while enhancing electrical performance by reducing propagation time for signals to traverse from one chip to another. Stacked dice allow a greater density of integrated circuits on a given area of the carrier, and may increase efficiency. Since each die in the stack would require an electrical connection to the carrier, or to another die, several layers of wire loops are formed. Correspondingly, it would be better for wire loops to be profiled as low as possible to cater for this need.

Thus, there is a desire in the semiconductor industry to seek to address this need to form wire loops with low height profiles. For example, U.S. Pat. No. 5,156,323 ("Wire Bonding Method") seeks to form a low wire loop by performing successive reverse action motions after making a first bond by moving a capillary away from the second bonding point before feeding sufficient wire to make a wire loop to connect the first bond to a second bonding point. Another example is U.S. Pat. No. 5,961,029 ("Wire Bonding Method") which also performs successive reverse action motions over a first bonding point, then forming a kink in an inclined portion of a trapezoidal wire loop before connecting the first bond to a second bonding point.

FIG. 1(a) is a side view of a conventional loop motion profile of a prior art wire bonding device employing reverse action motion. A bond is formed with wire fed out of a capillary at a first bonding point A. The capillary is then moved up by a certain distance to point B. Thereafter, the capillary is moved in a direction away from the second bonding point G in a reverse action motion to point C. The capillary is moved up by a further distance to point D, before the capillary executes another reverse action motion to point E. The capillary is then moved diagonally upwards to point F in a forward motion with such an amount of wire fed out as is necessary for forming a wire loop to a second bonding point G. Finally, the capillary is moved to the second bonding point G whereat a second bond is made.

FIG. 1(b) is a top view of the conventional loop motion profile of the said prior art wire bonding device. The motion of the capillary from the first bonding point A through to second bonding point G essentially forms a straight line from a top view of the capillary.

Using the aforesaid conventional bonding method, the ability to decrease the loop height of the wire is limited by the weakness caused to the neck of the wire at the point where the wire is bent towards the second bonding point, and the heat to which the wire is subjected. Such weakness in the neck of the wire is caused by the reverse motion of the capillary followed by pulling the wire in an opposite direction by the forward motion. If the loop height is less than 2.5 times of the wire diameter, the neck of the loop is at risk from cracking, making the resulting connection unreliable or unstable. Furthermore, if the neck is weakened, subsequent pulling of the wire during the process of forming the second bond may also potentially break the wire.

SUMMARY OF THE INVENTION

It is an object of the present invention to seek to provide an improved method of forming wire loops with lower height profiles as compared to the prior art, yet avoid some of the above disadvantages of the prior art.

According to a first aspect of the invention, there is provided a method of bonding wire between first and second bonding points with a bonding tool, comprising the steps of: forming a first bond at a first bonding point with the bonding tool; moving the bonding tool away from the first bond by a first distance; moving the bonding tool towards the first bonding point and coupling the wire to the first bond; moving the bonding tool away from the first bond by a second distance; forming a kink in the wire; moving the bonding tool to extend a sufficient length of wire to form a wire loop between the first and second bonding points; and thereafter moving the bonding tool to the second bonding point to form a second bond.

According to a second aspect of the invention, there is provided a wire loop including a wire bond comprising a ball-bonded base portion, a neck portion integrated with a top of the base portion and a wire extending from the neck portion substantially transversely to an axis passing through the base portion and the neck portion.

According to a third aspect of the invention, there is provided a wire loop including a wire bond comprising a ball-bonded base portion, a curved portion integrated with a side of the base portion which twists in a direction substantially transverse to an axis passing through the base portion and a bonding point of the wire bond, and a wire extending from the curved portion.

It would be convenient hereinafter to describe the invention in greater detail by reference to the accompanying drawings which illustrate preferred embodiments of the invention. The particularity of the drawings and the related description is not to be understood as superseding the generality of the broad identification of the invention as defined by the claims.

BRIEF DESCRIPTION OF THE DRAWINGS

Example of methods and wire loops formed in accordance with the invention will now be described with reference to the accompanying drawings, in which.

DETAILED DESCRIPTION OF THE PREFERRED EMBODIMENTS

Figure 1A:
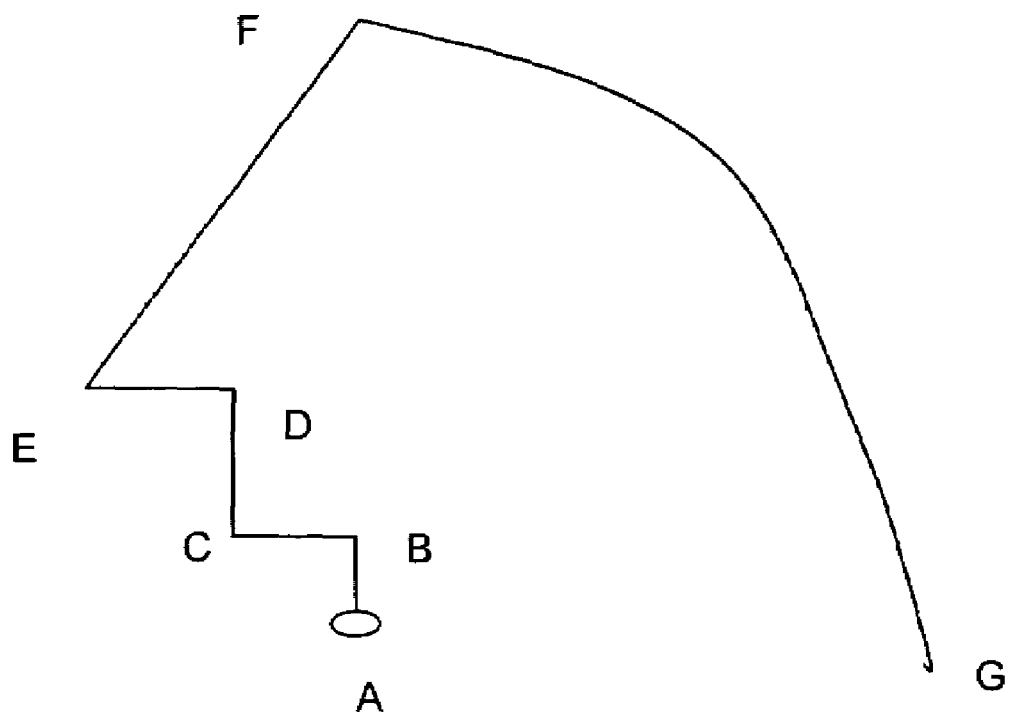
FIGS. 1(a) and 1(b) are side and top views respectively of a conventional loop motion profile of a prior art wire bonding device employing reverse action motion.
Figure 1B:
Figure 2A:
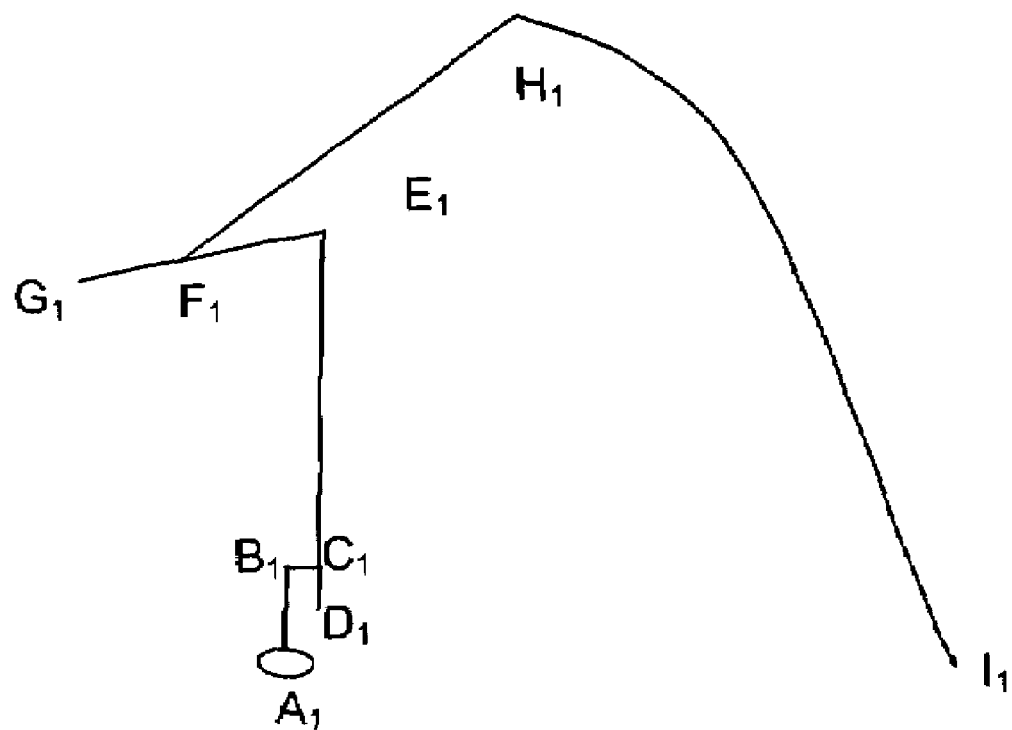
FIGS. 2(a) and 2(b) are side and top views respectively of a first preferred embodiment of a loop motion profile of a wire bonding device employing a wire bonding method according to the invention.

FIG. 2(a) is a side view representation of a first preferred embodiment of a loop motion profile of a wire bonding device employing a wire bonding method according to the invention. FIGS. 3(a) to 3(j) are diagrammatic illustrations showing the shapes of the bonding wire 12 at different positions of a bonding tool during loop formation according to this first embodiment.

A bonding tool, such as a capillary 10, feeds bonding wire 12 to bond the wire between a first bonding surface 14 and a second bonding surface 16. A profile of a wire loop 18 that is formed between the bonding surfaces 14, 16 is preferably as close as possible to the bonding surfaces 14, 16. A bond is first made at first bonding point $A_1$ on the first bonding surface 14. The capillary 10 is then moved away from the first bond by a first distance. This may be done moving the capillary 10 substantially vertically upwards by a certain distance to point $B_1$, and to point $C_1$ by a forward motion towards a second bonding point $I_1$ on the second bonding surface 16. This latter motion bends the wire 12.

From point $C_1$, the capillary 10 moves down towards the first bonding point $A_1$ to point $D_1$. This motion presses the wire 12 down, preferably ensuring that the highest point of the wire loop 18 relative to the first bonding point is less than or equal to 2.35 times of the wire diameter. At point $D_1$, the capillary 10 applies a predetermined force and ultrasonic energy onto the first bond to couple the wire 12 at the capillary opening to the first bond. This coupling process serves to prevent subsequent damage to the loop neck.

After that, the capillary 10 moves away from the first bond by a second distance. In this embodiment, the capillary 10 moves substantially vertically upwards to point $E_1$, and then moves away from the second bonding point in a reverse action motion to point $F_1$. At point $F_1$, the capillary 10 performs a twist motion from a first position at point $F_1$ in a direction away from the second bonding point $I_1$ to a second position at point $G_1$, and thereafter from the second position at point $G_1$ back to the first position at point $F_1$. This forms a kink 20 at a point of the wire 12 to ensure that there is a gap between the looped wire 18 and the bonding surfaces 14, 16.

The capillary 10 is then raised to point $H_1$ to feed a sufficient length of wire 12 to complete a wire loop 18 to the second bonding point $I_1$. Finally, the capillary 10 is moved down to the second bonding point $I_1$ in order to form a second bond.

Figure 2B:
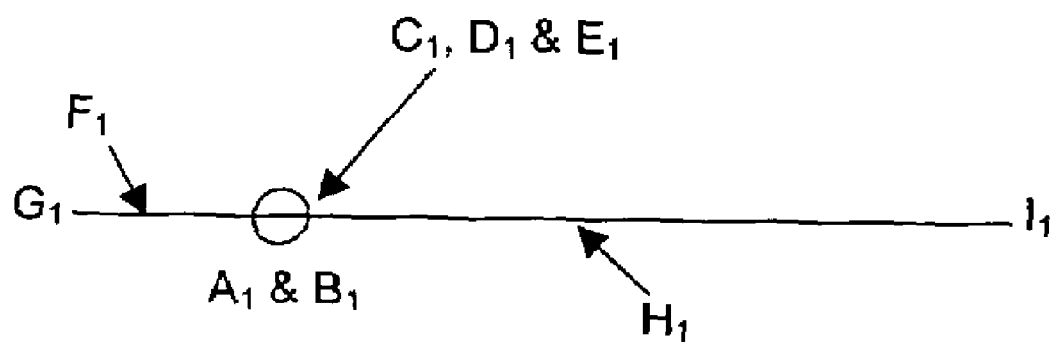
Figure 3:
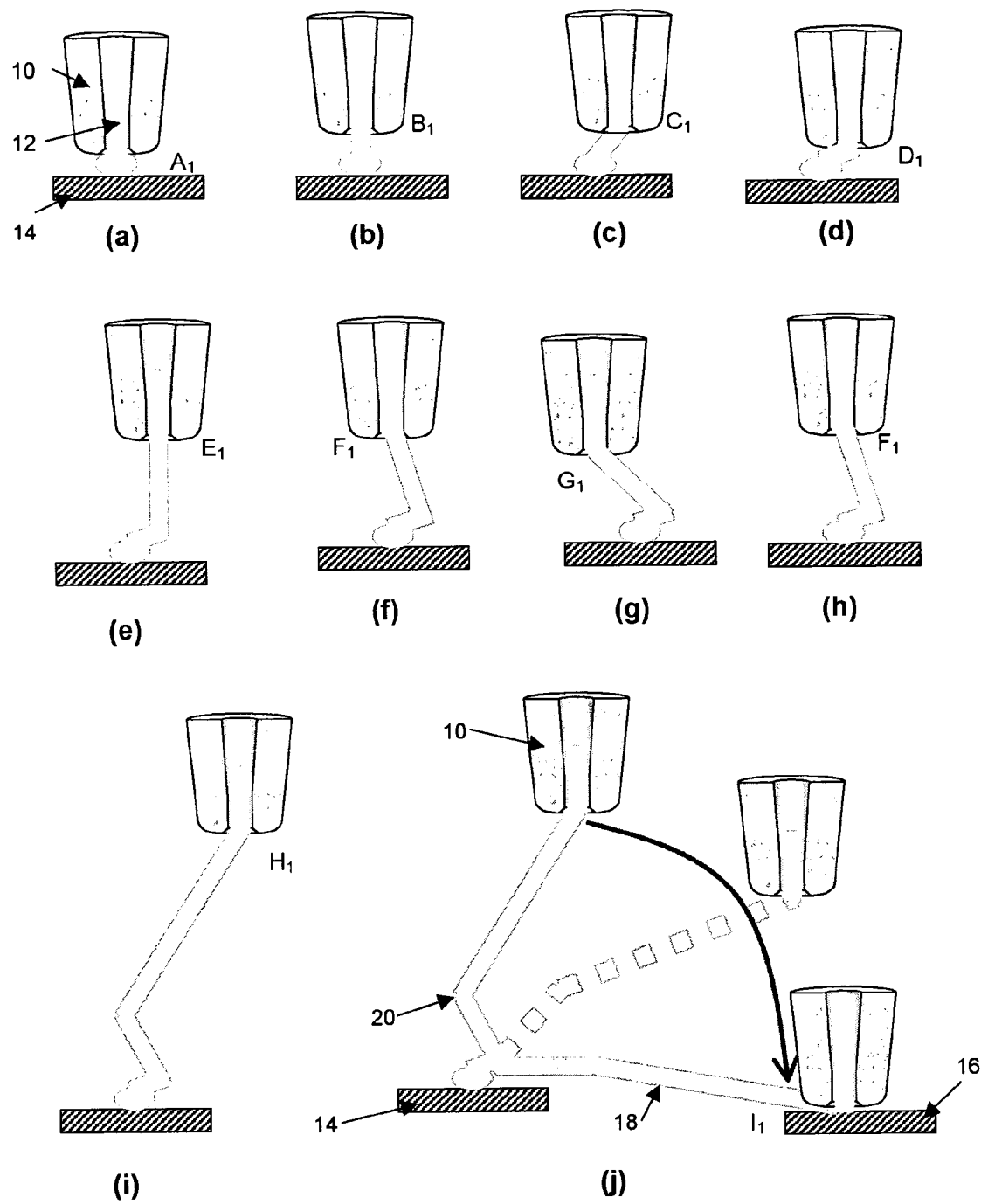
FIGS. 3(a) to 3(j) are diagrammatic illustrations showing the shapes of the bonding wire at different positions of a bonding tool during loop formation according to the first preferred embodiment of the invention.

FIG. 2(b) is a top view of the loop motion profile of FIG. 2(a). It would be observed that the motion of the capillary 10 from point $A_1$ through to point $I_1$ is generally in a straight line from a top view of the capillary 10.

Figure 4:
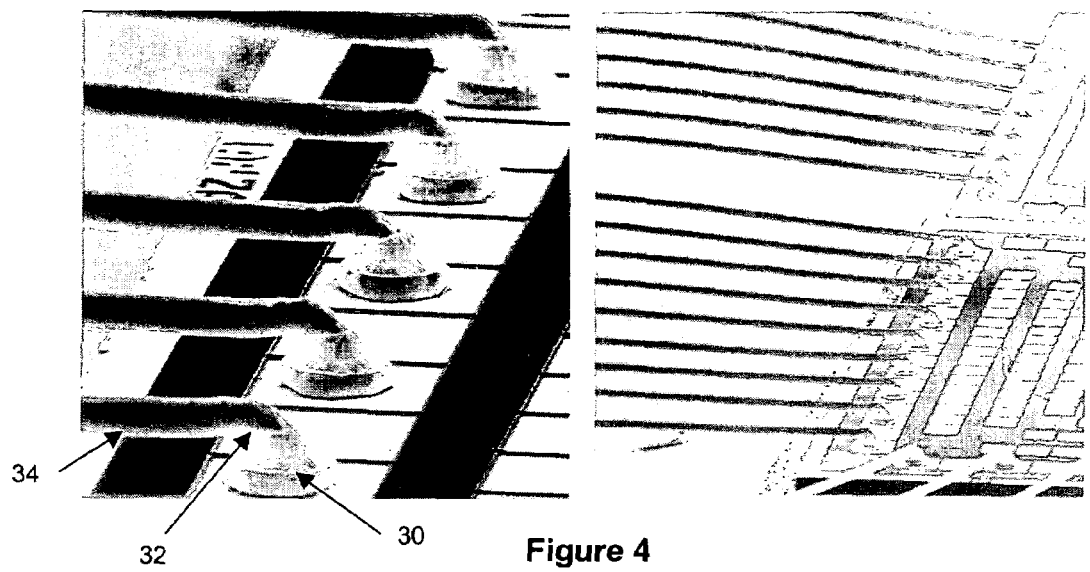
FIG. 4 illustrates perspective photographic views of low wire loops formed using the first preferred embodiment of the invention.

FIG. 4 illustrates perspective photographic views of low wire loops formed using the first preferred embodiment of the invention. The wire bond of the wire loop comprises a ball-bonded base portion 30, a neck portion 32 integrated with a top of the base portion 30 and a wire portion 34 extending from the neck portion substantially transversely to an axis passing through the base portion and the neck portion. Thus, there is virtually no vertical rise in the wire loop above the top of the base portion 30, besides a bend in the neck portion 32 to allow the wire portion 34 to extend transversely.

The loop base as such is not formed with a reverse action motion, and does not contribute to the risk of neck crack. A neck crack is usually characterized by a lack of uniformity in the neck portion of a wire loop. In the neck portion 32 of the wire loop illustrated in FIG. 4, the neck portion 32 has a substantially uniform cross-section area.

Further, it was found that when a diameter of the wire is approximately 0.8 mils (20 microns), a height of a highest point on the wire loop relative to the first bonding point, or bottom of the base portion, can be less than or equal to 2.35 times the diameter of the wire (47 microns). When a diameter of the wire is approximately 1.0 mil (25 microns), a height of a highest point on the wire loop relative to first bonding point can be less than or equal to 2.08 times the diameter of the wire (52 microns).

Figure 5A:
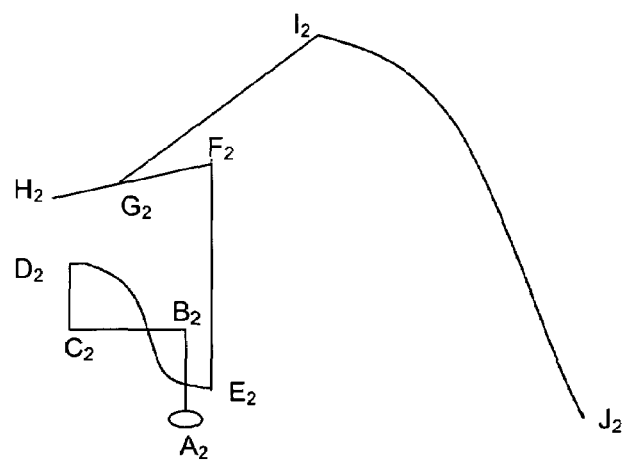
FIGS. 5(a) and 5(b) are side and top views respectively of a second preferred embodiment of a loop motion profile of a wire bonding device employing a wire bonding method according to the invention.

FIG. 5(a) is a side view representation of a second preferred embodiment of a loop motion profile of a wire bonding device employing a wire bonding method according to the invention. FIGS. 6(a) to 6(l) are diagrammatic illustrations showing the shapes of the bonding wire 12 at different positions of a bonding tool during loop formation according to this second embodiment.

A capillary 10 feeds bonding wire 12 to bond the wire between a first bonding surface 14 and a second bonding surface 16. A bond is first made at first bonding point $A_2$ on the first bonding surface 14. Then, the capillary 10 is moved away from the first bond by a first distance. In this embodiment, the capillary is moved substantially vertically upwards by a certain distance to point $B_2$, and is thereafter moved away from a second bonding point $J_2$ on the second bonding surface 16 in a reverse action motion to point $C_2$.

Preferably, the reverse action motion from point $B_2$ to point $C_2$ is in a curved motion, so as to bend the wire 12 in a curved trace outside a vertical plane passing through the first bonding point $A_2$ and the second bonding point $J_2$. This curved motion helps to avoid neck crack so that the loop base will not be damaged by subsequent forward motion of the capillary 10.

The capillary 10 is raised by a further distance from point $C_2$ to point $D_2$, feeding some wire 12 during this movement. It is subsequently moved down near to the first bonding point $A_2$, in a curved motion towards the vertical plane passing through the first bonding point $A_2$ and the second bonding point $J_2$, ending at point $E_2$. This motion presses the wire 12 down, preferably so as to ensure that the wire loop 18 relative to the first bonding point is less than 2.1 times of the wire diameter. The capillary 10 applies force and ultrasonic energy to couple the wire 12 at the opening of the capillary to the first bond.

After that, the capillary 10 is moved away from the first bond by a second distance. This may be done by moving the capillary 10 substantially vertically upwards to point $F_2$, and then moving the capillary 10 away from the second bonding point $J_2$ in a reverse action motion to point $G_2$. At point $G_2$, the capillary 10 moves in a twist motion from a first position at point $G_2$ to a second position at point $H_2$, and then from the second position at point $H_2$ back to the first position at point $G_2$, so as to form a kink 20 at a point in the wire loop 18. As in the previous embodiment, this kink helps to ensure that there is a gap between the wire loop 18 and the bonding surfaces 14, 16.

Thereafter, the capillary 10 is moved upwards to point $I_2$ to feed a sufficient length of wire 12 to complete a wire loop 18. Finally, the capillary 10 is moved down to the second bonding point $J_2$ in order to form a second bond.

Figure 5B:
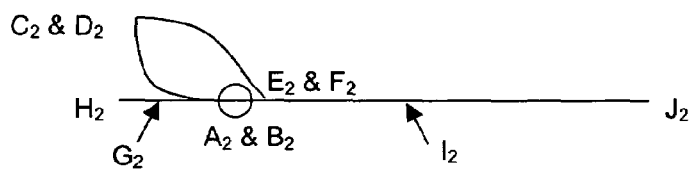
Figure 6:
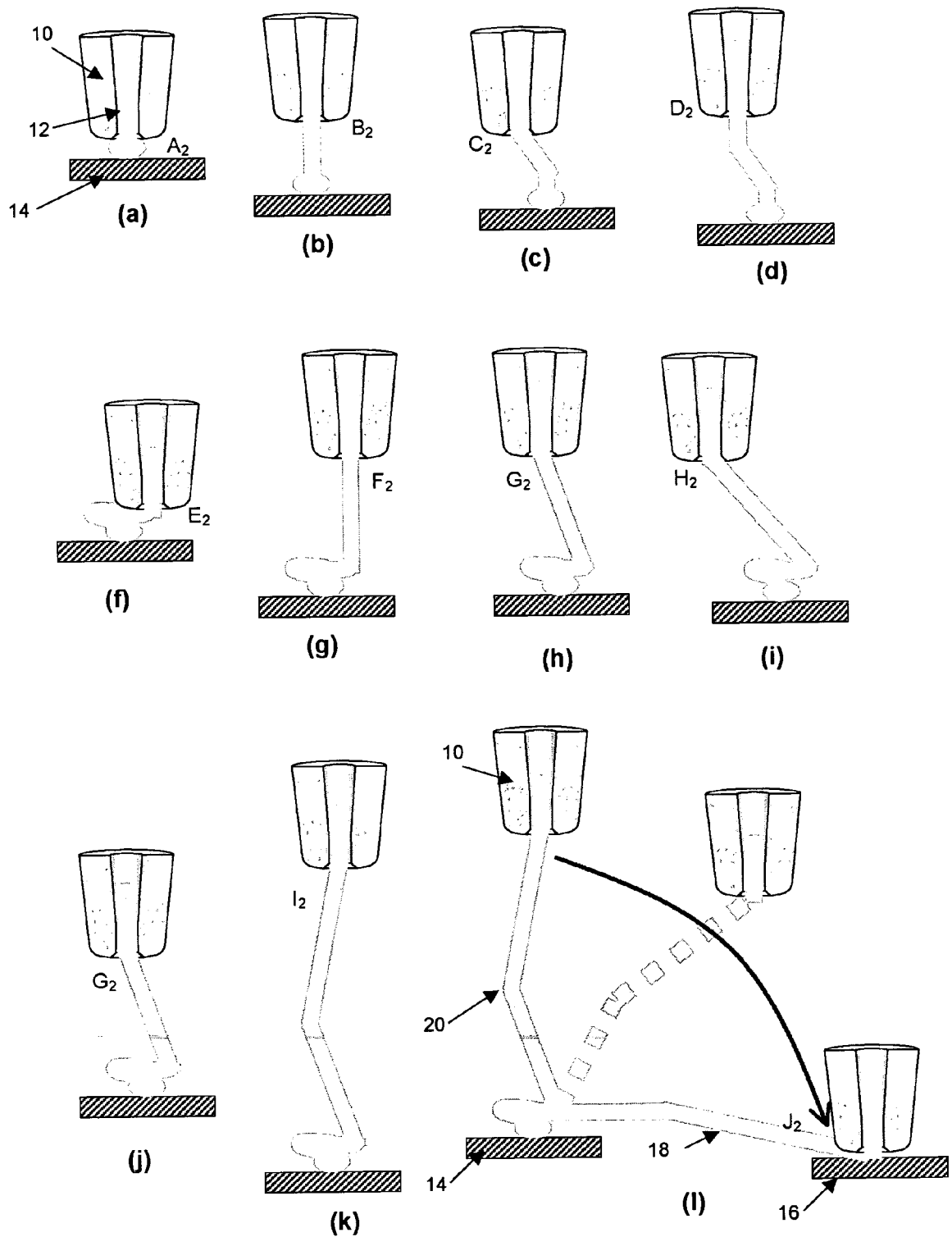
FIGS. 6(a) to 6(l) are diagrammatic illustrations showing the shapes of the bonding wire at different positions of a bonding tool during loop formation according to the second preferred embodiment of the invention.

FIG. 5(b) is a top view of the loop motion profile of FIG. 5(a). From this view, it can be observed that the capillary 10 follows a curved profile between point $B_2$ and point $C_2$, and between point $D_2$ and point $E_2$. These curved motions contribute to avoiding neck crack.

Figure 7:
FIG. 7 illustrates perspective views of low wire loops formed using the second preferred embodiment of the invention.
Figure 7:
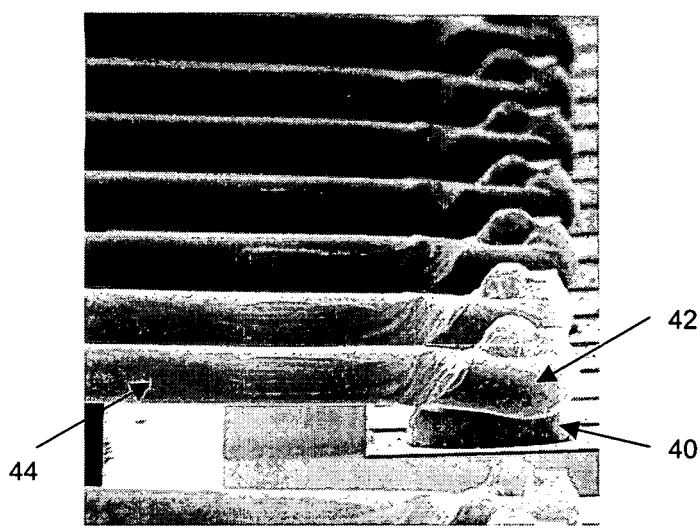

FIG. 7 illustrates perspective photographic views of low wire loops formed using the second preferred embodiment of the invention. The wire bond of the wire loop comprises a ball-bonded base portion 40, a curved portion 42 integrated with a side of the base portion which twists in a direction substantially transverse to an axis passing though the base portion 40 and the first bonding point, and a wire 44 extending from the curved portion 42. There is no vertical rise of the wire above the base portion 40.

Figure 8:
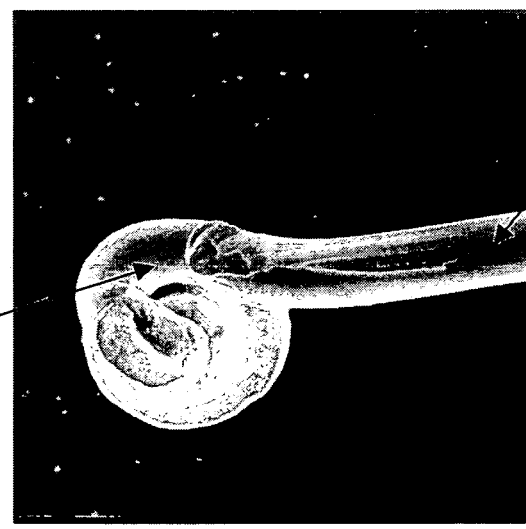
FIG. 8 illustrates a top view of a low wire loop formed using the second preferred embodiment of the invention.

FIG. 8 illustrates a top view of a low wire loop formed using the second preferred embodiment of the invention. The curved portion 42 of the final loop base formation is circular in shape around the base portion 40, thus contributing to a lower loop height as compared to the first embodiment of the invention. Neck crack is also avoided by creating the curved deformation around the base of the loop formation. A characteristic of this deformation is that the curved portion 42 has a substantially uniform cross-sectional area. There is no double-impact or further mechanical deformation that interferes with such uniformity. This enhances the reliability of the bond and the electrical connection made. The curved portion 42 preferably extends along at least a part of a perimeter of the base portion 40, as shown in FIG. 8 wherein the curved portion extends around approximately half the perimeter of the base portion 40.

Using this embodiment, when the diameter of the wire is approximately 0.8 mils (20 microns), a height of a highest point on the wire loop relative to the first bonding point, or bottom of the base portion 40, can be kept to less than or equal to 2.1 times the diameter of the wire (42 microns). When the diameter of the wire is approximately 1.0 mil (25 microns), a height of a highest point on the wire loop relative to the first bonding point can be less than or equal to 2.0 times the diameter of the wire (50 microns).

The invention described herein is susceptible to variations, modifications and/or additions other than those specifically described and it is to be understood that the invention includes all such variations, modifications and/or additions which fall within the spirit and scope of the above description.

The invention claimed is:

1. A method of bonding wire between first and second bonding points with a bonding tool, comprising, in the order stated, the steps of:
   forming a first bond at the first bonding point with the bonding tool;
   moving the bonding tool to a first position spaced from the first bond by a first distance;
   moving the bonding tool from the first position towards the first bonding point and applying a pressing force on the first bond with the wire but without forming a second bond of the wire;
   moving the bonding tool to a second position spaced from the first bond by a second distance;
   forming a kink in the wire;
   moving the bonding tool to extend a sufficient length of wire to form a wire loop between the first and second bonding points; and
   thereafter moving the bonding tool to the second bonding point and forming a second bond.

2. A method according to claim 1, wherein:
   the first position is substantially vertically above the first bonding point; and
   the step of moving the bonding tool to the first position includes the steps of moving the bonding tool substantially vertically upwards and thereafter moving the bonding tool towards the second bonding point while keeping the bonding tool substantially vertically over the first bond.

3. A method according to claim 1, wherein the step of moving the bonding tool away from the first bond to the first position includes the steps of moving the bonding tool substantially vertically upwards and thereafter moving the bonding tool away from the second bonding point.

4. A method according to claim 3, wherein the step of moving the bonding tool away from the second bonding point comprises moving the bonding tool in a curved motion to a point outside a vertical plane passing through the first and second bonding points.

5. A method according to claim 4, including the step of subsequently moving the bonding tool towards the first bonding point in a curved motion to a point on the vertical plane passing through the first and second bonding points before applying the force on the first bond with the wire.

6. A method according to claim 1, wherein the step of moving the bonding tool away from the first bond to the second position comprises the step of moving the bonding tool substantially vertically upwards.

7. A method according to claim 6, including the step of moving the bonding tool away from the second bonding point after moving the bonding tool vertically upwards.

8. A method according to claim 1, wherein the step of forming a kink in the wire comprises the steps of moving the bonding tool from the second position to a third position in a direction away from the second bonding point, then from the third position to a fourth position still further away from the second bonding point, and then from the fourth position back to the third position.

9. A method according to claim 1, wherein a diameter of the wire is approximately 1.0 mil or less and a height of a highest point on the bonded wire relative to the first bonding point is less than or equal to 2.35 times the diameter of the wire.

* * * * *